US010861220B2

(12) United States Patent
Troy et al.

(10) Patent No.: US 10,861,220 B2
(45) Date of Patent: Dec. 8, 2020

(54) DATA ACQUISITION AND ENCODING PROCESS FOR MANUFACTURING, INSPECTION, MAINTENANCE AND REPAIR OF A STRUCTURAL PRODUCT

(71) Applicant: The Boeing Company, Chicago, IL (US)

(72) Inventors: James J. Troy, Issaquah, WA (US); Todd J. Sleeman, Duvall, WA (US); Nikoli Prazak, Renton, WA (US); William McGarry, Federal Way, WA (US); Aaron A. Dost, Kent, WA (US); David Michael Roni, Renton, WA (US)

(73) Assignee: The Boeing Company, Chicago, IL (US)

(*) Notice: Subject to any disclaimer, the term of this patent is extended or adjusted under 35 U.S.C. 154(b) by 356 days.

(21) Appl. No.: 15/842,196

(22) Filed: Dec. 14, 2017

(65) Prior Publication Data

US 2019/0188900 A1 Jun. 20, 2019

(51) Int. Cl.
*G06T 15/20* (2011.01)
*G06F 3/0481* (2013.01)
(Continued)

(52) U.S. Cl.
CPC .............. *G06T 15/20* (2013.01); *G05B 17/02* (2013.01); *G06F 3/0483* (2013.01);
(Continued)

(58) Field of Classification Search
CPC .......... G06F 3/011; G06F 16/25; H04L 63/20; G06Q 10/06; G06Q 40/08; G06T 7/001; G06T 13/80; G06T 15/20
See application file for complete search history.

(56) References Cited

U.S. PATENT DOCUMENTS

2004/0153437 A1* 8/2004 Buchan ................. G06Q 10/06
2006/0197764 A1* 9/2006 Yang ........................ G06T 13/80
345/473
(Continued)

OTHER PUBLICATIONS

Crickard, P., "Link 3d Model to QR Code," Feb. 3, 2012. https://paulcrickard.wordpress.com/2012/02/03/link-3d-model-to-qr-code/.
(Continued)

*Primary Examiner* — Kandasamy Thangavelu
(74) *Attorney, Agent, or Firm* — Womble Bond Dickinson (US) LLP

(57) ABSTRACT

A method is provided that includes generating a report template usable to produce a report to convey information about a structural product or one or more of a plurality of parts thereof, rendering for display. A model of the structural product is observed from a home viewpoint. Input is received to navigate the model to a part selected from the plurality of parts, the model at the navigated viewpoint including information for the part selected from the plurality of parts. A command string is generated that includes information specifying the navigated viewpoint. The command string is output to a recorder configured to record the command string on at least one of a physical medium or to an electronic document in which the command string is thereby included, the command string capable of being machine-read to automatically restore the model at the navigated viewpoint.

21 Claims, 9 Drawing Sheets

(51) Int. Cl.
| | |
|---|---|
| *G06F 3/0484* | (2013.01) |
| *G05B 17/02* | (2006.01) |
| *G06F 3/0483* | (2013.01) |
| *G06F 30/15* | (2020.01) |
| *G06F 16/904* | (2019.01) |
| *G06F 3/0488* | (2013.01) |

(52) U.S. Cl.
CPC ...... *G06F 3/04815* (2013.01); *G06F 3/04847* (2013.01); *G06F 30/15* (2020.01); *G06F 3/0488* (2013.01); *G06F 16/904* (2019.01)

(56) References Cited

U.S. PATENT DOCUMENTS

| | | | |
|---|---|---|---|
| 2007/0003162 A1* | 1/2007 | Miyoshi | G06T 15/20 382/276 |
| 2010/0315416 A1* | 12/2010 | Pretlove | G06T 7/001 345/419 |
| 2016/0232615 A1* | 8/2016 | Le | G06Q 40/08 |
| 2017/0199645 A1 | 7/2017 | Troy et al. | |
| 2018/0032605 A1* | 2/2018 | Deshpande | G06F 16/25 |
| 2018/0114595 A1* | 4/2018 | Stern | H04L 63/20 |
| 2018/0143756 A1* | 5/2018 | Mildrew | G06F 3/011 |

OTHER PUBLICATIONS

Doyle, C., "BIM 360 Field—Utilize Rooms/Spaces from Revit," Aug. 9, 2015. https://www.linkedin.com/pulse/bim-360-field-utilize-roomsspaces-from-revit-colin-doyle.
BIManywhere, 2012-2017, http://bimanywhere.com/features.php.

* cited by examiner

DATA ACQUISITION AND ENCODING PROCESS FOR MANUFACTURING, INSPECTION, MAINTENANCE AND REPAIR OF A STRUCTURAL PRODUCT

TECHNOLOGICAL FIELD

The present disclosure relates generally to manufacturing, inspection, maintenance and repair of a structural product and, in particular, to a data acquisition and encoding process for manufacturing, inspection, maintenance and repair of a structural product.

BACKGROUND

Many modern manufactured systems and other structural products such as aircraft have extensive maintenance requirements and data records. Current maintenance data systems allow technicians to retrieve technical manuals and other maintenance information for a system type being worked on in portable computer or handheld computing devices for ease of access to necessary information. Many systems additionally include recorded maintenance information specific to the exact system being examined. This allows technicians access to necessary information without having to leave the work area to view manuals, data records or computer terminals with the desired information.

Quality issues are frequently identified during the aircraft production build cycle. The first step in resolving the issue is to accurately document the issue, which often includes identifying facts such as the parts involved, the location in the aircraft coordinate system and installation authority. Just finding part numbers and relaying that information to others is a difficult and time-consuming task. For example, once an issue is identified, a user must begin exploring the engineering documentation to look up the necessary information. This could require spending hours to find and validate the information due to the large amount of engineering definition required for a large commercial aircraft. A significant number of the documented issues have incorrect or missing information or are duplications because of the difficulties in accurately collecting the required information. When this happens, the issue reports must be routed back to the initiators for correction. This overall process is time consuming and can result in significant delays during the build cycle when any disruption could result in delayed deliveries.

BRIEF SUMMARY

The present disclosure is generally directed to manufacturing, inspection, maintenance and repair of a structural product and, in particular, to data acquisition and encoding for manufacturing, inspection, maintenance and repair of a structural product. In accordance with example implementations, a user of a digital 3D model viewer may identify a part of a structural product (e.g., aircraft) at a specific 3D location, then save that information in machine-readable format, and record the formatted information on some physical medium or electronic document at the point-of-use. A user may later return to that location, read the machine-readable information from the physical medium or electronic document and bring their computer system to the same state acquired by the initial user. This may save time for repeat visits to the location, since the follow-on users do not need to perform the location and identification steps again. It also reduces the possibility of data transcription errors.

Example implementations of the present disclosure may have benefit in a number of different use cases, including airplane-on-ground (AOG), emergent removal (ER) and non-conformance (NC). The present disclosure thus includes, without limitation, the following example implementations.

Some example implementations provide a method comprising generating a report template usable to produce a report to convey information about a structural product or one or more of a plurality of parts thereof; rendering for display, a model of the structural product observed from a home viewpoint; receiving input to navigate the model to a part selected from the plurality of parts, observation of the model being moved from the home viewpoint to a navigated viewpoint, the model at the navigated viewpoint including information for the part selected from the plurality of parts; generating a command string that includes information specifying the navigated viewpoint; and outputting the command string to a recorder configured to record the command string on at least one of a physical medium or to an electronic document in which the command string is thereby included, the command string including the information specifying the navigated viewpoint being in a machine-readable format and capable of being machine-read from the physical medium or electronic document to automatically restore the model at the navigated viewpoint, wherein the report template is loadable and configured to automatically populate with the information for the part of the plurality of parts in the model at the navigated viewpoint.

In some example implementations of the method of the preceding example implementation, or any combination of any preceding example implementations, the information specifying the navigated viewpoint of the model includes look-from, look-direction, up-direction, and field-of-view values.

In some example implementations of the method of the preceding example implementation, or any combination of any preceding example implementations, the command string including the information specifying the navigated viewpoint is in the machine-readable format of an automatic identification and data capture (AIDC) technology, and wherein outputting the command string includes outputting the command string to the recorder compatible with the AIDC technology.

In some example implementations of the method of the preceding example implementation, or any combination of any preceding example implementations, the information for the part of the plurality of parts includes at least a name and location of the part in the structural product, the name and location being retrievable from the model at the navigated viewpoint based on a selected point and a part associated with the selected point.

In some example implementations of the method of the preceding example implementation, or any combination of any preceding example implementations, outputting the command string further includes outputting an image of the model at the navigated viewpoint to the recorder that is configured to record the command string and the image on the physical medium, or to the electronic document in which the command string and the image are thereby included, the command string and the image being associated with one another on the physical medium or in the electronic document.

In some example implementations of the method of the preceding example implementation, or any combination of any preceding example implementations, the method further includes executing a software function including a user interface configured to load and display the report template for the part of the plurality of parts selectable in the model at the navigated viewpoint and automatically populate the report template with the information for the part of the plurality of parts at the navigated viewpoint, the user interface also being configured to present or accept information for a manufacturing, inspection, maintenance, or repair procedure that involves the part in order to produce the report.

In some example implementations of the method of the preceding example implementation, or any combination of any preceding example implementations, outputting the command string includes outputting the command string to the recorder configured to record the command string on the physical medium that is or is affixed to a sheet of paper, and wherein the method further comprises grouping the sheet of paper and other sheets of paper on which other command strings are recorded, each of the other command strings including information specifying a respective navigated viewpoint of the model to a respective part of the plurality of parts.

In some example implementations of the method of the preceding example implementation, or any combination of any preceding example implementations, outputting the command string includes outputting the command string to an electronic page of the electronic document in which the command string is thereby included, and wherein the method further comprises composing the electronic document including the electronic page and other electronic pages including other command strings, each of the other command strings including information specifying a respective navigated viewpoint of the model to a respective part of the plurality of parts.

Some example implementations provide an apparatus comprising a processor and a memory storing executable instructions that, in response to execution by the processor, cause the apparatus to at least perform the method of any preceding example implementation, or any combination of any preceding example implementations.

Some example implementations provide a computer-readable storage medium that is non-transitory and has computer-readable program code portions stored therein that, in response to execution by a processor, cause an apparatus to at least perform the method of any preceding example implementation, or any combination of any preceding example implementations.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
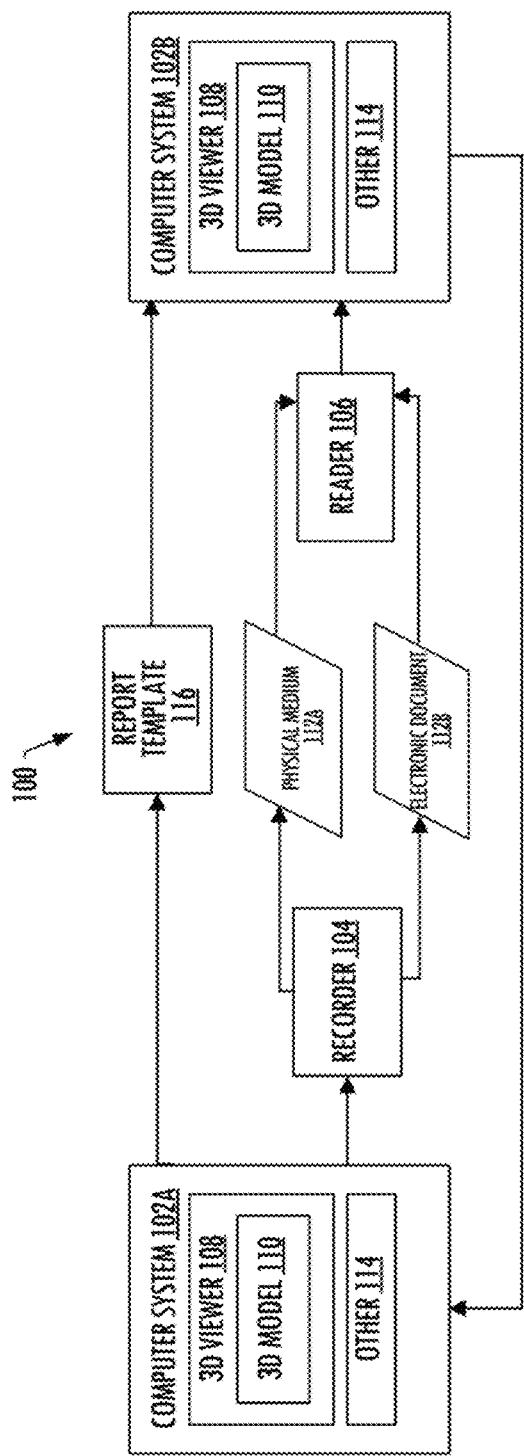
FIG. 1 illustrates a system according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. Furthermore, it should be understood that unless otherwise specified, the terms "data," "content," "information," and similar terms may be at times used interchangeably. Like reference numerals refer to like elements throughout.

Example implementations of the present disclosure relate generally to manufacturing, inspection, maintenance and repair of a structural product and, in particular, to a data acquisition and encoding process for manufacturing, inspection, maintenance and repair of a structural product. Example implementations will be primarily described in conjunction with aerospace applications in which the structural product is an aircraft. It should be understood, however, that example implementations may be utilized in conjunction with a variety of other applications, both in the aerospace industry and outside of the aerospace industry. Other examples of suitable structural products include any of a number of different types of vehicles, such as spacecraft, watercraft, motor vehicles, railed vehicles, buildings, and the like. Another example implementation of the present disclosure is in the medical field, where suitable structural products may include organic objects (e.g., the human body), medical equipment, medical facilities, patient information systems, and the like.

Some example implementations of the present disclosure provide a process in which digital information including three-dimensional (3D) location, part identification and/or task specific-information for a part of a structural product (e.g., aircraft) may be extracted from a 3D-enabled application program. This extracted information may be formatted as machine-readable information and recorded on a physical medium or to an electronic document, and be grouped with other extracted information at a point-of-use. The information may then be extracted from the physical medium or the electronic document later and used to return the application program to a known viewpoint and information representation state, or used by another application program to store or transmit the information.

In some contexts, example implementations of the present disclosure allow the same user or a different user at the point-of-use to identify an issue for a part of a structural product, locate and extract or otherwise machine-read the extracted information associated with the part of the structural product in the physical medium or the electronic document at the point-of-use to return the application program to the known viewpoint and information representation state associated with the part of the structural product, and record the issue in a report template to generate a report. This capability may be useful in a number of different contexts, such as aircraft manufacturing and maintenance, as well as other application programs using location data. This process enables application programs, such as viewers of models of structural products, to be used on-site to capture, record, and receive point-of-use data more efficiently and with fewer mistakes.

Some other example implementations of the present disclosure provide a process that links together physical media or electronic documents and digital information for use in application programs involving manufacturing, inspection, maintenance and/or repair. This process may assist in documenting part removals and repairs utilizing a three-dimensional (3D) model of the structural product including the parts. The process may leverage the ability to display the model of a fully-configured structural product such as a large commercial aircraft to enable rapid navigation through the digital environment to find part specific information (e.g., a part name, part number, and 3D coordinate location of a part) for any physical instance of the part that needs repair or removal at any level of a hierarchical part list (e.g., detail, assembly, installation). A user interface of a 3D-enabled application program such a 3D viewer of models can be tailored for different use cases to support the collection, review and/or validation of information to document the removal or repair. Validated information may be transferred into other information systems as desired. The information captured may include command strings executable via a web browser, spreadsheet, or other suitable application to quickly restore the viewpoint in the digital scene. And as introduced above, the process may also support the creation of physical media in which the machine-readable information is a part of or affixed to the physical media or a portion thereof and then grouped together (e.g., a binder) or creation of electronic documents in which the machine-readable information is included in the electronic document or a portion thereof and composed (e.g., a webpage), and that may be read later to provide quick access to pertinent information and to restore the known viewpoint in the digital scene.

FIG. 1 illustrates a system 100 according to example implementations of the present disclosure. The system may include any of a number of different subsystems (each an individual system) for performing one or more functions or operations. As shown, for example, the system may include one or more of each of a computer system 102A, B, recorder 104 and reader 106. The system as shown includes two computer systems, one of which is coupled to the recorder, and the other of which is coupled to the reader. It should be understood, that in some examples, a single computer system may be coupled to both the recorder and reader. Moreover, although shown as part of the system, it should be understood that any of the computer system, recorder or reader may function or operate as a separate system without regard to the others. It should also be understood that the system may include one or more additional or alternative subsystems than those shown in FIG. 1.

As described in greater detail below, the computer system 102A, B may be generally configured to execute one or more computer programs, including a three-dimensional (3D) viewer 108 configured to render for display, a digital model 110 of a structural product composed of a plurality of parts, such as a 3D computer-aided design (CAD) or other similar model (sometimes referred to as a solid model). The 3D viewer may render the digital model in accordance with a number of techniques, such as those employed by CAD viewers and other 3D visualization applications. These types of applications use a graphics engine, such as OpenGL or Direct3D, to render sequences of images representing the models contained within a virtual environment. Some examples include virtual reality modeling language (VRML) viewers, X3D viewers, Java 3D viewers, QuickTime virtual reality (VR) or QTVR viewers, or the like.

In one example, the model 110 may represent the structural product as a collection of "primitives" such as edges, faces, points (e.g., vertices) and the like, which may be arranged into polygons or other arithmetically-derived structures to represent the geometry of surfaces, volumes or parts of the respective structural product. The structural product may be defined by a "boundary" representation, or collection of polygons that demarcate the space occupied by the structural product, which may include sub-collections of polygons that demarcate spaces occupied by respective parts of the structural product. Each of these sub-collections of polygons may be referred to as a 3D object that corresponds to part of the structural product in the model. For some structural products, the model may use hundreds of thousands, millions or even billions of polygons, which may be arranged in thousands of sub-collections of polygons (3D objects) corresponding to several thousands of parts.

The model 110 may include information that may indicate a design type of the model, such as a conceptual model, preliminary design, released design or the like. The model may include information (e.g., name, number, quantity, source, material, 3D location, related parts) regarding the structural product and/or one or more of its parts. The model may even further include additional information that in some examples, with the model, may compose a model-based definition (MBD) of the structural product. For example, the model may include product manufacturing information (PMI) such as geometric dimensions and tolerances (GD&T), material specifications, component lists, process specifications, inspection requirements or the like. Additionally or alternatively, for example, the model may include information specifying various manufacturing, inspection, maintenance and/or repair procedures, each of which may include one or more tasks involving (user) interaction with one or more parts of the structural product. In various examples, this additional information may be provided directly in the model, or in metadata associated with the model.

The 3D viewer 108 may be configured to render the digital model 110 of the structural product in a scene in which the digital model is observed from a particular point of view (or viewpoint). The 3D viewer may open or otherwise initially render the model observed from a home viewpoint, such as a viewpoint in which the whole of the structural product is observed. The 3D viewer may then receive input to navigate the digital model through a number of different operations such pan, tilt and/or zoom operations, which may move the viewpoint of the digital model from its home to another viewpoint. In some examples, the input may be user input to navigate to a specific digital model within the environment. In other examples, the input may be automated input such as from various types of location tracking, or semi-automated input such as from users assisted with one or more sensors. Regardless of the particular type of input, in this manner, the scene may be focused on a part of the structural product, or more particularly the 3D object corresponding to a part of the structural product. Information regarding the part may also be similarly acquired from the digital model or metadata associated with it. As introduced above, this information may include, for example, the name and/or number of the part, the 3D location of the part in the structural product, information specifying procedure(s) involving the part, and the like. As described herein, the 3D location of a part may refer to its 3D coordinate position and rotational orientation.

In accordance with example implementations of the present disclosure, the 3D viewer 108 may be further configured to extract the information that specifies the navigated (e.g., user-navigated) viewpoint of the digital model, as well as information regarding the part on which the rendered scene at that viewpoint is focused (e.g., name, number, 3D location, procedure(s)), and generate a command string that includes this extracted information. The 3D viewer may then output the command string to the recorder 104 configured to record the command string on at least one of a physical medium 112A or to an electronic document 112B in which the command string is thereby included. The command string may include extracted information that may be in a machine-readable format. As used herein, "machine-readable format" may include human-readable data that is marked up so that it can be easily read by machines (e.g., microformats, resource description framework in attributes (RDFa), hypertext markup language (HTML)) and/or machine-readable data intended principally for processing by machines (e.g., resource description framework (RDF), extensible markup language (XML), JavaScript Object Notation (JSON)).

In some other example implementations, the 3D viewer 108 may also output the rendered scene at that viewpoint to the recorder 104. The rendered scene may be in the format of an image of the model (e.g., screenshot) at the navigated viewpoint. In this manner, the recorder 104 may be configured to record the command string and the image on the physical medium 112A or the electronic document 112B in which the command string and the image are thereby included. In some implementations, the command string and the image may be associated (e.g., grouped) with one another on the physical medium 112A or in the electronic document 112B so that a user may be able to visually associate the command string with the image.

The particular format of the machine-readable information may differ depending on context, but may be according to any of a number of different automatic identification and data capture (AIDC) techniques. Examples of suitable AIDC techniques include barcode (linear or matrix), bokode, radio frequency identification (RFID) (passive, active or battery-assisted passive RFID), magnetic stripes, optical character recognition (OCR), integrated circuit card (ICC) (contact or contactless) and the like. In many of these formats, the machine-readable information is not in human-readable format; but for at least OCR, the machine-readable information may be both in machine-readable format and human-readable format.

The recorder 104 and manner in which the command string is recorded on the physical medium 112A or electronic document 112B may likewise differ depending on the format of the machine-readable information. As explained in greater detail below, in some examples, the recorder 104 may be a printer configured to print a barcode or OCR-interpretable text including the command string on the physical medium that is or is affixed to (e.g., glued, taped, stapled, hung from) a sheet of paper. The "sheet of paper" as used herein may be any type of media on which the recorder 104 is capable of recording the command string in machine-readable format. For example, the sheet of paper may be a sheet of material formed as a fiber-based product, a vellum, a parchment, a cellulose acetate, and the like. In other examples, the recorder 104 may be a RFID writer configured to write an RFID tag affixed to a sheet of paper, a magnetic strip encoder configured to encode a magnetic strip affixed to a sheet of paper, or an ICC encoder configured to encode an embedded integrated circuit of an ICC affixed to or that may form the sheet of paper.

In some implementations, the system 100 is caused to group the sheet of paper and other sheets of paper on which the command string is recorded to or affixed thereon. For example, the physical medium 112A is a loose-leaf binder including sheets of paper each having one or more command string recorded thereon, each of the other command strings including information specifying a respective navigated viewpoint of the model to a respective part of the plurality of parts. An index, table of contents, or other reference provided with the physical medium 112A may enable quick referral to each of the command strings provided therein. Other examples, of physical medium 112A may include a folio, a line-up of the sheets on a surface such as a wall or table, and the like.

The recorder 104 may also be a hypertext system configured to record (e.g., link) a hypertext or hyperlink including the command string to an electronic page of the electronic document 112B. The "electronic page" may be a position in a webpage, a page of a word processing document, a page of a spreadsheet document, a page of a portable document format (PDF) document, a text editor file, and/or any other digital representation in which the recorder 104 is capable of recording the command string in machine-readable format. The hyperlink or hypertext may be in the form of HTML code, XML linking language (XLink), etc.

In some implementations, the system 100 is caused to compose the electronic document 112B including the electronic page and other electronic pages in which the command string is included. For example, the electronic document 112B is a word processing document including electronic pages each having one or more command string recorded thereon, each of the other command strings including information specifying a respective navigated viewpoint of the model to a respective part of the plurality of parts. An index, table of contents, or other reference provided with the electronic document 112B may enable quick referral to each of the command strings provided therein. Other examples, of electronic document 112B may include a webpage, a spreadsheet document, a PDF document, a text editor file, and/or any other digital representation.

Regardless, the command string may then be carried by the physical medium 112A or the electronic document 112B for later retrieval of information about the part from the physical medium 112A or the electronic document 112B, such as at some point-of-use of the structural product including the part, which may involve the reader 106.

The reader 106 may be configured to interface with a computer system 102 B, or more particularly a software application, such as a 3D viewer 108 of the computer system, to read and interpret the machine-readable information from the physical medium 112A or the electronic document 112B. In certain embodiments, the reader 106 may employ AIDC technology similar to that employed by the recorder 104 to read the machine-readable information recorded on the physical medium 112A or in the electronic document 112B, which again, may differ depending on the format of the machine-readable information. For example, the reader may be a barcode reader configured to read a barcode from a physical medium, a camera configured to record an image of OCR-interpretable text from a physical medium, or an input device configured to click or tap the hypertext or hyperlink included at an electronic document. In other examples, the reader 106 may be a RFID reader configured to read an RFID tag affixed to a physical medium, a magnetic strip reader configured to read a magnetic strip affixed to a physical medium, an ICC reader configured to read an embedded integrated circuit of an ICC affixed to or that may form a physical medium, or a caret configured to read a hyperlink or hypertext included in an electronic document. In other embodiments, the reader 106 may employ AIDC technology different than that employed by the recorder 104.

The 3D viewer 108 and computer system 102B may be the same or different from that which generated the command string, and interfaced with the recorder 104 to read the command string recorded on the physical medium 112A or at the electronic document 112B. In some examples, the 3D viewer may be different but of the same type as that involved in generation of the command string, and configured to render the digital model 110 of the structural product including the part to which the information pertains. The machine-readable information read from the physical medium 112A or the electronic document 112B may include a navigated viewpoint of the digital model, and the 3D viewer may automatically render the digital model observed from the navigated viewpoint. The machine-readable information may also include information for the part including, for example, the part's name, number and/or 3D location, and/or procedure(s) involving the part, which the 3D viewer may be configured to automatically display.

In addition to or in lieu of the 3D viewer 108, in some examples, the reader 106 may be configured to interface with one or more other computer programs 114 executable by the computer system 102B to read and interpret the machine-readable information recorded on the physical medium 112A or at the electronic document 112B. In some examples, the other program(s) may provide respective software-based systems such as information systems, computer-aided design (CAD) systems, manufacturing execution systems (MESs), building management systems, and the like. Examples of suitable information systems may include authority systems such as Reference Engineering Data Automated Retrieval System (REDARS). Other examples of suitable information systems may include transaction processing systems, office systems, decision support systems, knowledge management systems, database management systems, office information systems. Yet other examples of suitable information systems may include data warehouses, resource planning systems, enterprise systems, expert systems, search engines, geographic information systems, global information systems, office automation systems and the like.

In some examples, the information read from the physical medium 112A or the electronic document 112B may be compressed or encoded. In these examples, the 3D viewer 108 or recorder 104 may be configured to perform the compression/encoding, and the reader 106 or 3D viewer 108 may be configured to perform the decompression/decoding. But encoding as formatted clear text, as described above, may allow users with general-purpose devices with integrated cameras and scanning applications (like those commonly available on smartphones) to capture the encoded information recorded on the physical medium 112A or at the electronic document 112B information as text and paste or otherwise transfer that into a document or email. The data may also be stored in an encrypted format on the physical medium 112A or at the electronic document 112B that can be decrypted using an encryption key on the receiving computer system 102B.

In some examples, color elements can be added to the physical medium 112A or the electronic document 112B to help differentiate command strings, such as to allow the 3D viewer 108 to respond differently to different colors. In some examples in which the machine-readable information is printed, the machine-readable information may be printed using an ink that is only revealed by ultraviolet (UV) light.

By encoding the viewpoint into the physical medium 112A or the electronic document 112B, the 3D viewer 108 does not require a separate location tracking process to determine the appropriate viewpoint from which to render the model. This approach also eliminates the need for repeated searching and identifying parts and/or procedure information. The part name, number and/or 3D location included in the command string may be available for subsequent users to quickly scan (machine-read) and jump right to the part and automatically populate other application data fields. This may also reduce if not eliminate some of the main bottlenecks in inspection and repair procedures.

Such application data fields may include a report template 116 comprising a unique non-executable file format intended to be loaded by the 3D viewer 108. The report template 116 may be generated by the computer system 102B and may be configured to be loaded at the same computer system 102B or a different computer system. In this manner, the generated report template 116 is usable to produce a formatted report to convey information about a structural product or one or more of a plurality of parts thereof. Such information may include metadata or additional information provided directly in the model, or in metadata associated with the model, at the navigated viewpoint. As such, the report template is loadable and configured to automatically populate with the information for the part of the plurality of parts in the model at the navigated viewpoint in order for a user who is the same or different than the user generating the template, to report issues concerning the part.

Figure 2A:
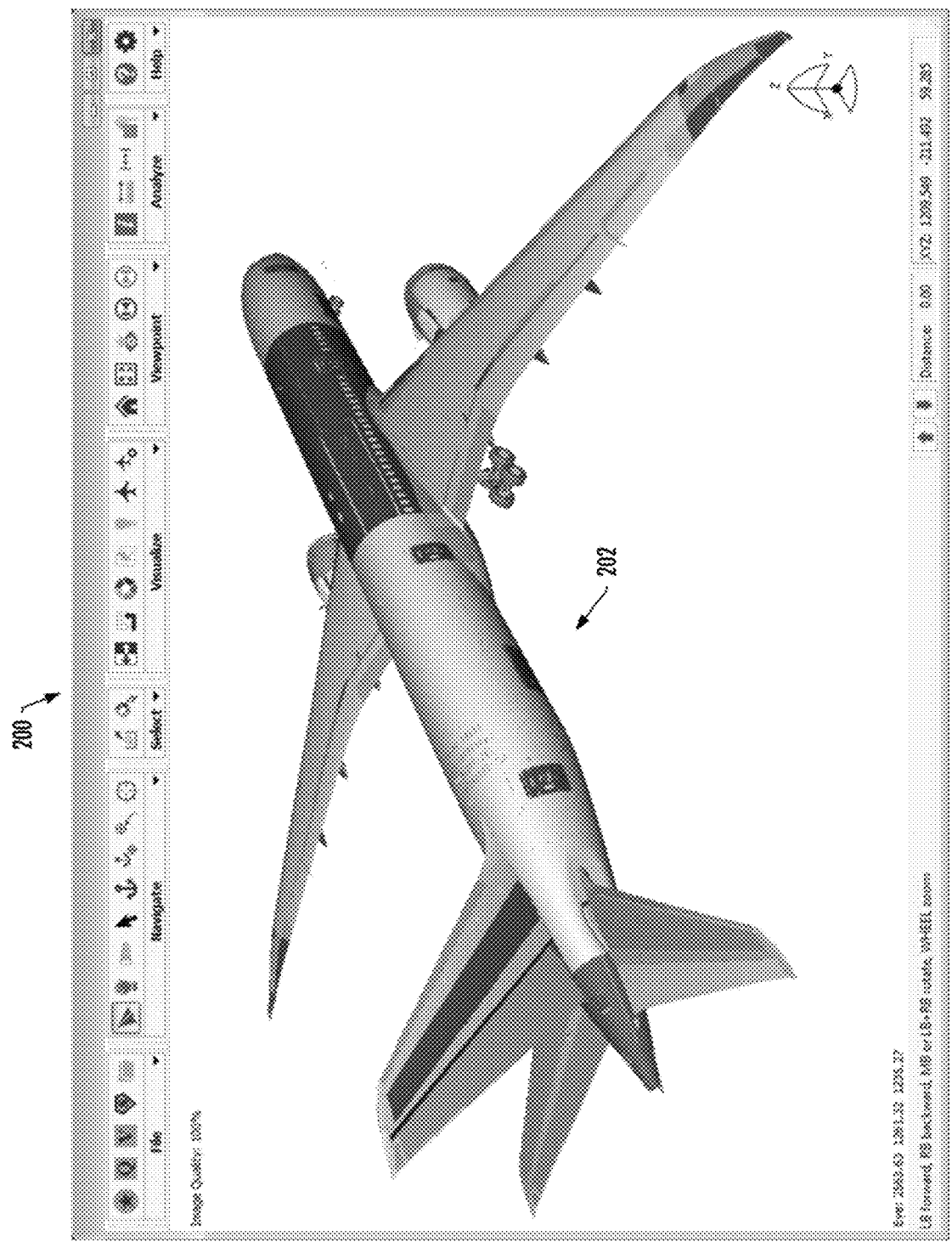
FIGS. 2A and 2B illustrate a three-dimensional (3D) viewer displaying a digital 3D model of an aircraft in respectively home and navigated viewpoints, according to example implementations.
Figure 2B:
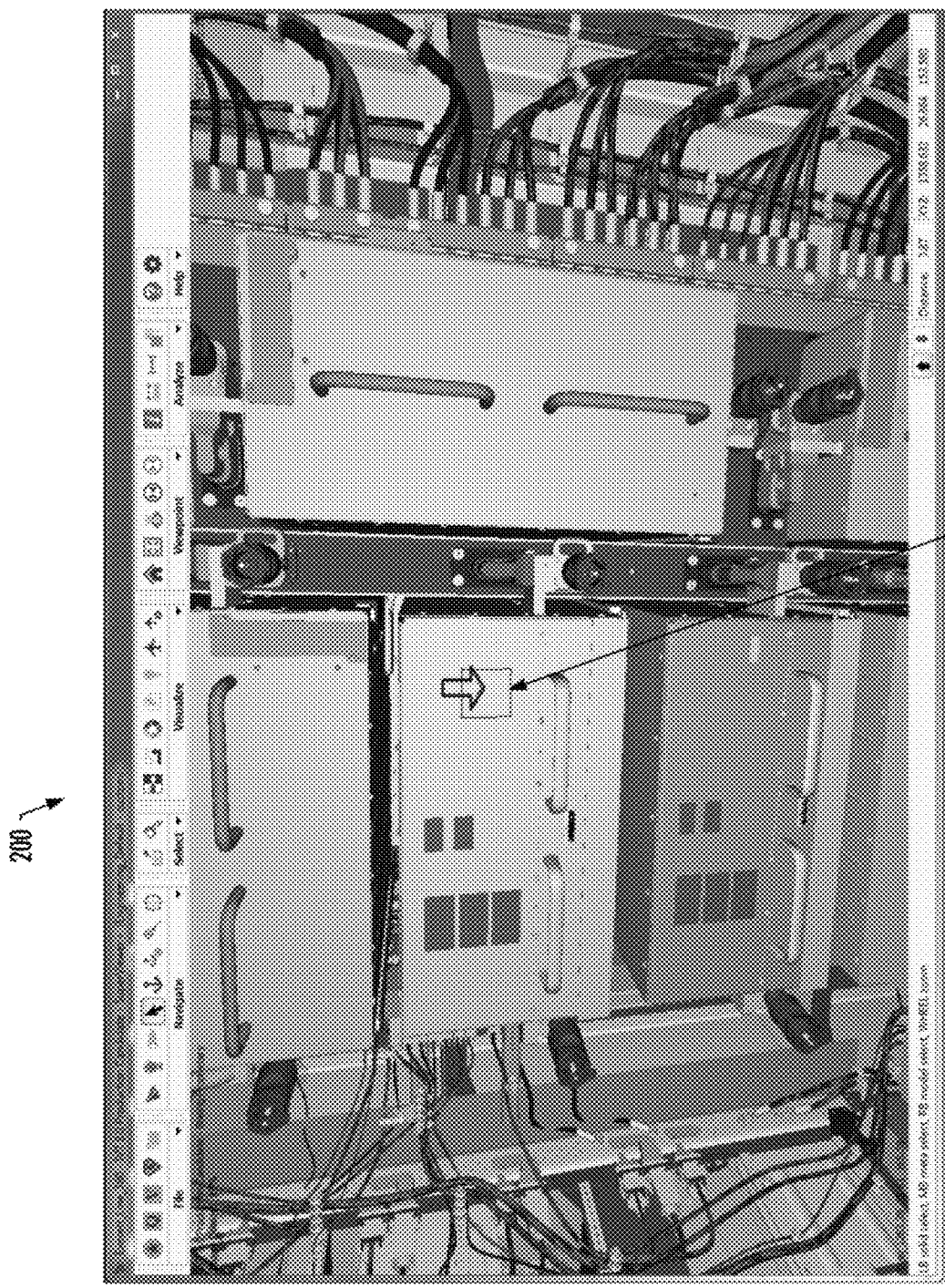

To further illustrate example implementations of the present disclosure, FIGS. 2A and 2B illustrate a 3D viewer 200 and digital model 202 of an aircraft (structural product) that are suitable examples of respectively the 3D viewer 108 and digital model 110 of FIG. 1. As shown in FIG. 2A, the 3D viewer may open or otherwise initially render the model observed from a home viewpoint, such as a viewpoint in which the whole of the aircraft is observed. As shown in FIG. 2B, through navigation, the viewpoint of the model may move to focus the scene on a 3D object 204 for a part of the aircraft, highlighted by the arrow in the center electronics module in FIG. 2B. In reference to FIG. 1, the 3D viewer may extract information that specifies the navigated viewpoint, as well as information regarding the part, generate a command string that includes this extracted information, and interface with the recorder 104 to record the command string on a physical medium 112A or in an electronic document 112B.

Figure 3A:
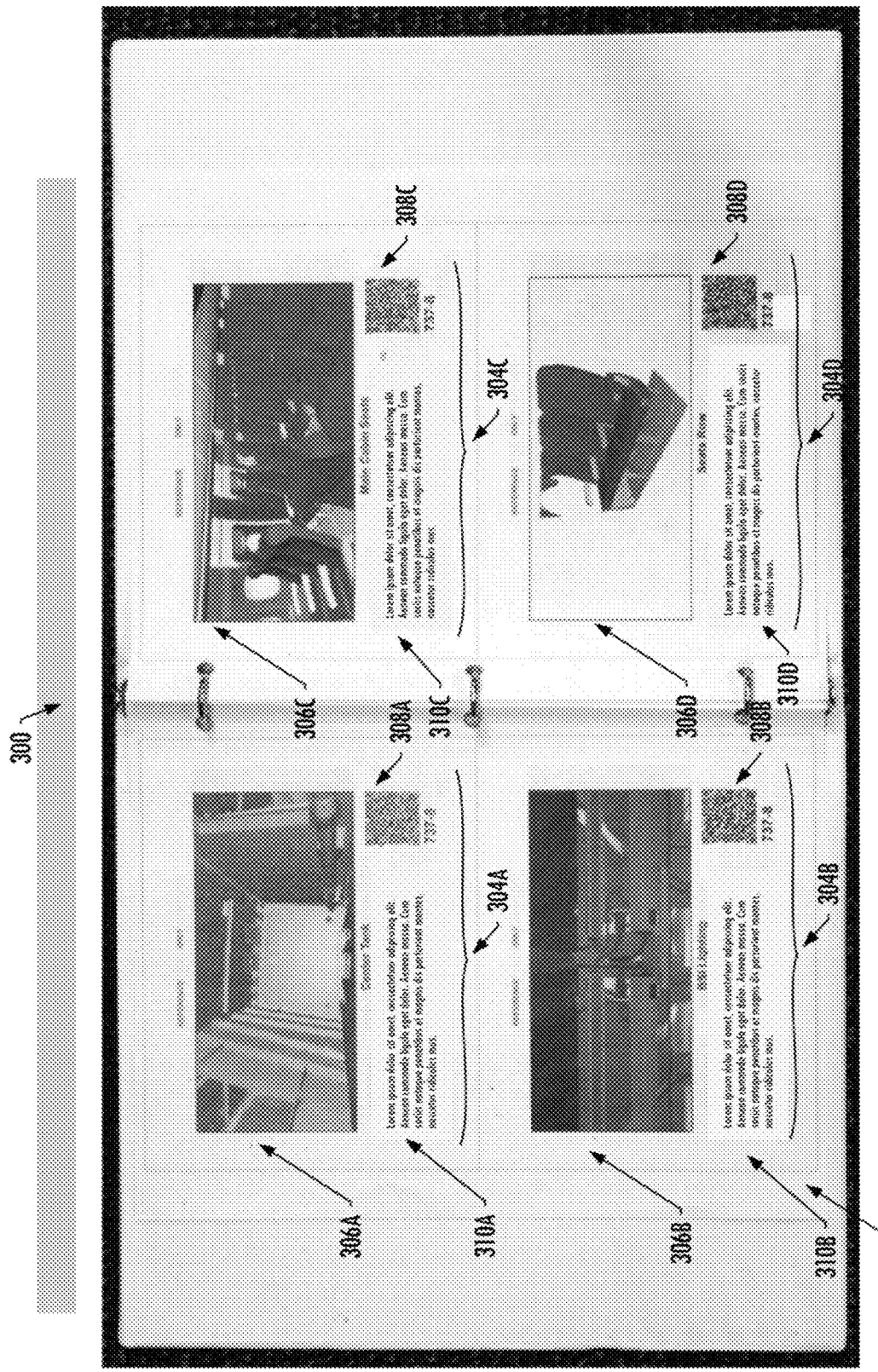
FIG. 3A illustrates a physical medium including an embedded command string and screenshot image of the model at the navigated viewpoint according to example implementations.
Figure 3B:
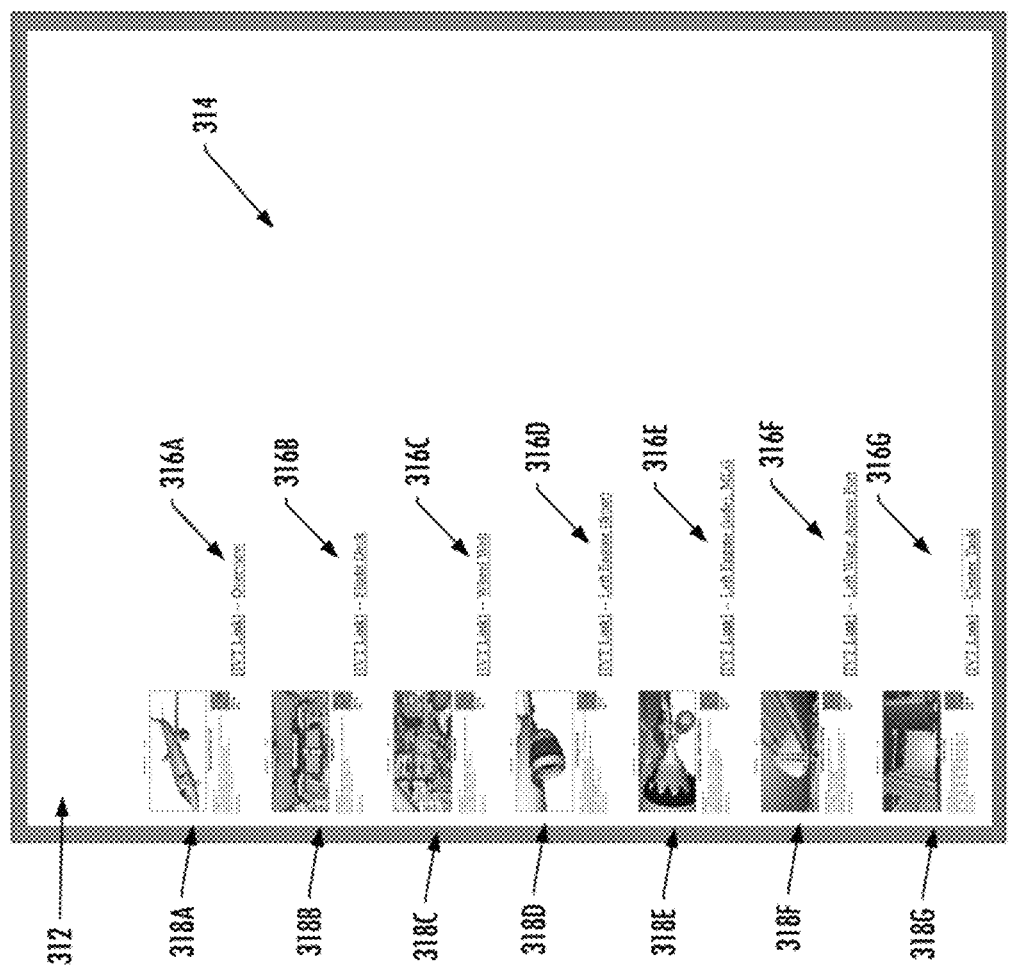
FIG. 3B illustrates an electronic document including a command string and thumbnail image of the model at the navigated viewpoint according to example implementations.

To further illustrate examples of suitable physical media and electronic documents that may be produced in accordance with example implementations of the present disclosure, reference is now made to FIGS. 3A and 3B, respectively each of which illustrates a command string recorded therein.

As shown in FIG. 3A, a physical medium 300 in the form of a loose-leaf binder is illustrated. The loose-leaf binder 300 includes sheets of paper 302 that are grouped together within the loose-leaf binder. Four embedded command strings 304A-D are recorded (e.g., printed) in machine-readable and human-readable format. Associated images 306A-D are also recorded, respectively. For example, each of the command strings 304A-D include a computer-readable matrix barcode 308A-D (as shown, for example, a QRcode or Data Matrix code) and human-readable text 310A-D. The computer-readable matrix barcode 308A-D is a machine-readable format of the command string and may contain information specifying the navigated viewpoint that is the same as or different than the information readable by the human-readable text 310A-D. In the illustrated examples, the encoded data of the matrix barcode is stored in an American Standard Code for Information Interchange (ASCII) format, which can then be interpreted by the 3D viewer 108 coupled to the reader 106. Other formats may also be suitable, including markup language formats such as XML that have defined field tags for each item.

The information readable from the human-readable text 310A-D shown in FIG. 3A may be, for example, information identifying a model of aircraft and location information.

Additionally, the associated images 306A-D may be an image of the model at the navigated viewpoint that is associated with the command string 304A-D, respectively. Like the command string 304A-D, the associated images 306A-D are configured to be output to the recorder, which is then configured to record the command strings 304A-D and the images 306A-D on the physical medium 300 such that they are clearly associated with one another. More particularly, the associated images 306A-D recorded on the physical medium 300 act as visual references to the scene that users (e.g., mechanics) may be viewing in real-time. This allows those users to identify the part at issue that they are looking for in real-time by utilizing the physical medium 300 to quickly navigate to the scene based on the associated images 306A-D.

The reader 106 may be configured to read the computer-readable matrix barcode 308A-D. Once read by the reader 106, the 3D viewer 108 may interpret the information included therewith in order to identify the format to use for extraction of the ASCII data into appropriate internal variables. In other implementations, other arrangements are possible, such as binary data. For example, information may specify the viewpoint, including plug coordinates in, for example, ten variables which may be selected from: three look-from values, three look-direction values, three up-direction values and a field-of-view value. Other application-specific information that can be automatically interpreted by the 3D viewer, can also be included on the computer-readable matrix barcode 308A-D.

As shown in FIG. 3B, an electronic document 312 in the form of a webpage is illustrated. The webpage 312 includes an electronic page 314 (e.g., a portion of the webpage) that is composed with other electronic pages (e.g., other portions of the webpage) including other command strings. On the electronic page 314 seven distinct command strings 316A-G are included (e.g., created) in machine-readable format. Associated images 318A-G are also included (e.g., loaded), respectively. For example, each of the command strings 316A-G includes hypertext that is in machine-readable format and may contain information specifying the navigated viewpoint. In the illustrated examples, the hypertext includes anchor text presented as a descriptor of the associated image 318A-G and embedded information specifying the navigated viewpoint (target). The embedded information specifying the navigated viewpoint may be transferred in any number of ways. For example, the embedded information may be in hypertext transfer protocol (HTTP) format, that may be automatically detected upon selection thereof, and a suitable HTTP call executed. The HTTP format may then be interpreted by the 3D viewer 108 coupled to the reader 106. Other formats may also be suitable, including markup language formats such as XML that have defined field tags for each item.

The hypertext 316A-G in FIG. 3B may include additional information as specified by an application programming interface (API) of the 3D viewer 108, and may be represented as follows:

316A: Overview
316B: Flight Deck
316C: Wheel Well
316D: Left Engine (front)
316E: Left Engine (side), MLG
316F: Left Wing Access Port
316G: Center Tank Additionally, the associated images 318A-G may be a thumbnail image of the model at the navigated viewpoint that is associated with the hypertext, respectively Like the hypertext, the associated images 318A-G are configured to be output to the recorder, which is then configured to record the hypertext and the image 318A-G in the electronic document 312 such that they are associated with one another. More particularly, the associated images 318A-G recorded in the electronic document 312 act as visual references to the scene that users (e.g., mechanics) may be viewing in real-time. This allows those users to identify the part at issue that they are looking for in real-time by utilizing the electronic document 312 to quickly navigate to the scene based on the associated images 318A-G.

The reader 106 may be configured to read (e.g., interpret) the hypertext 316A-G. Once read by the reader 106, the 3D viewer 108 may interpret the information included therewith to identify the format to use for extraction of the data into appropriate internal variables. For example, information may specify the viewpoint, including plug coordinates in, for example, ten variables, which may be selected from: three look-from values, three look-direction values, three up-direction values and a field-of-view value. Other application-specific information that can be automatically interpreted by the 3D viewer with access to the tag formats, can also be included in the hypertext 316A-G.

As will be appreciated, example implementations of the present disclosure may have a number of different uses, and may be used to link physical media or electronic documents with digital information, such as part names, numbers, 3D location, procedure(s) and other appropriate manufacturing, inspection, maintenance and repair information. Example implementations may leverage visualization of a digital model 110 of a structural product on a portable computer or other computer system 102A, B. The digital model may be manipulated to a navigated viewpoint to coincide with a user's view of the physical instance such that information associated with a physical instance of a part may be retrieved without knowing any more about that part than its location on the structural product. A command string including information specifying the navigated viewpoint may be output and recorded on a physical medium or to an electronic document, where the command string may contain pertinent machine-readable information (e.g., in machine-readable format and/or human-readable format) to help reestablish future digital visualization sessions. With the complete information of a part and its assembly available in the physical medium or electronic document, a user may be able to identify an issue at the physical instance of the part, scan the command string and automatically restore the digital model at the navigated viewpoint. Therein, a report template may be loaded at the navigated viewpoint in the digital model and automatically populated with the information for the part in the model to produce a report during a procedure such as repair or removal.

Figure 4:
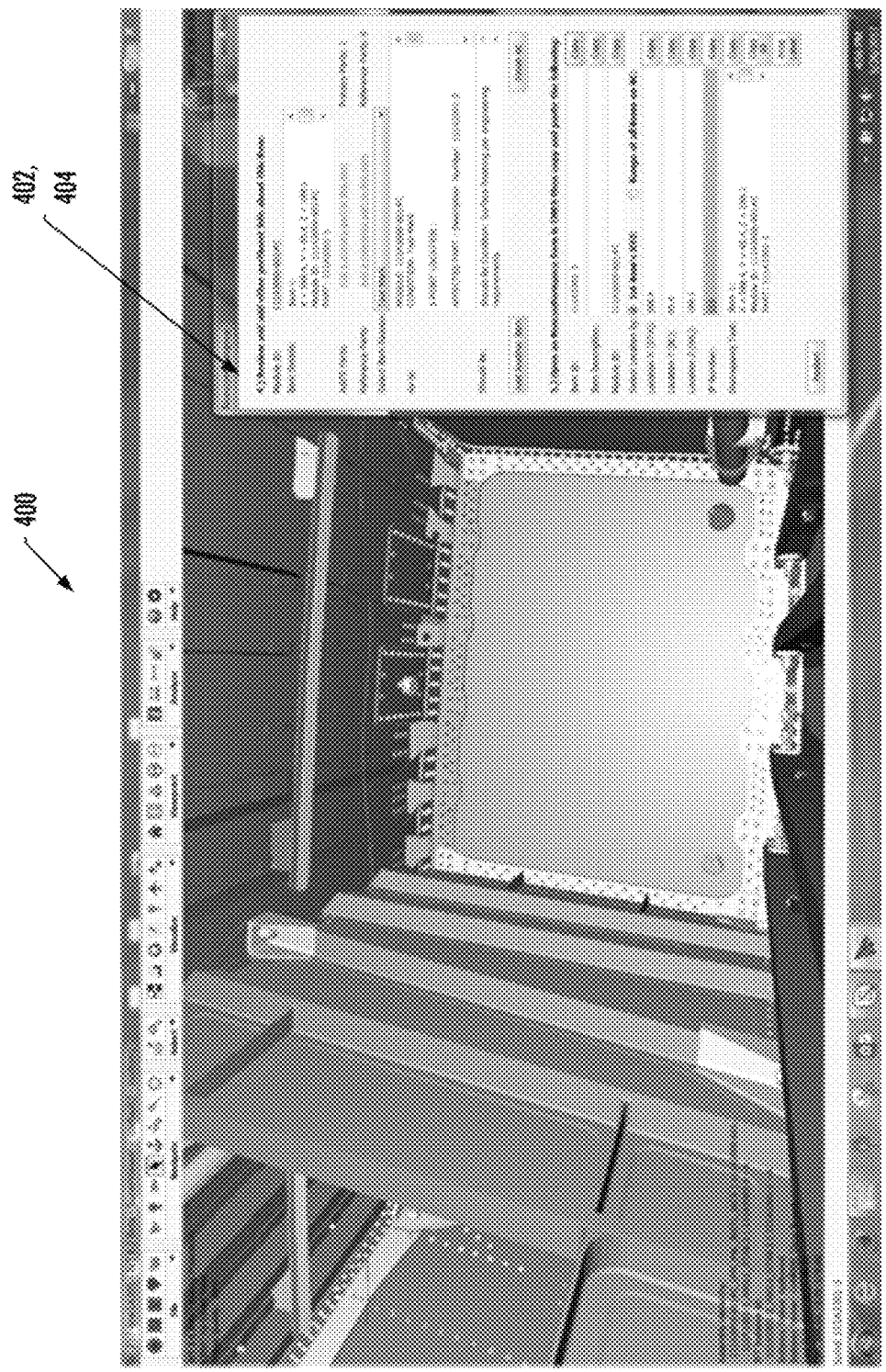
FIG. 4 illustrates a user interface (UI) displaying a 3D model of a part of an aircraft and a report template populated with information for the part according to example implementations.

In some example implementations, the report is produced from a report template 116. FIG. 4 illustrates a 3D viewer displaying a digital model 400 at a navigated viewpoint for a part at issue, with the remaining 3D parts of the digital model being outside of the viewing frustum, outside of the clipping planes, or occluded by other parts. The user may execute a software function from the 3D viewer, which may include a user interface (UI) 402 (the UI at times simply referred to as the software function). In some examples, the software function and its UI may be tailored to a particular use case (e.g., part removal on an in-service airplane, or NC in final assembly).

The user may select the part at issue from the digital model 400, which may cause the software function including the UI to be executed. Otherwise, the user may select the part at issue and then execute the software function including the UI. The UI 402 is then configured to load and display the report template 404 (e.g., report template 116) at the navigated viewpoint of the digital model 400.

The UI 402 may also automatically populate the report template 404 with the information for the 3D part of the plurality of parts at the navigated viewpoint. The UI 402 may also be configured to present or accept information for the NC (or otherwise any other manufacturing, inspection, maintenance, or repair procedure) that involves the part in order to produce the report. The user may be able to manually enter (e.g., cut-paste, type) in any additional information into one or more fields of the UI 402, such as a description of the issue (e.g., length or depth of a scratch or dent, gaps, fiber breakout, elongated hole dimensions, and many other types of defects), current work location or work instruction identifier. The software function may include an appropriate UI control to allow the user to copy information from the UI, which may then be transferred (e.g., pasted) into other appropriate systems as desired or required. The report template may thereby collect information in a single place before producing the report.

Prior to producing the report, the user may validate that information shown in the digital model 400 and automatically populated into the report template is accurate in one or more engineering drawings or other technical documentation, such as may be provided by one or more authority systems (e.g., REDARS). This may be accomplished using link(s) or UI control(s) from the UI, which may cause display of the part of interest in the authority system(s). The user may also validate the NC is not already documented in an appropriate MES using link(s) from the UI that automatically display information dynamically retrieved from the authority system showing the part and plans (shop order instance (SOI) of interest.

Example implementations may have applicability in a number of different use cases, including manufacturing, inspection, maintenance and/or repair of a structural product such as an aircraft. Examples of suitable use cases include airplane-on-ground (AOG), emergent removal (ER) and non-conformance (NC). Other suitable examples include customer pickup, in-work assembly/disassembly and the like.

Figure 5A:
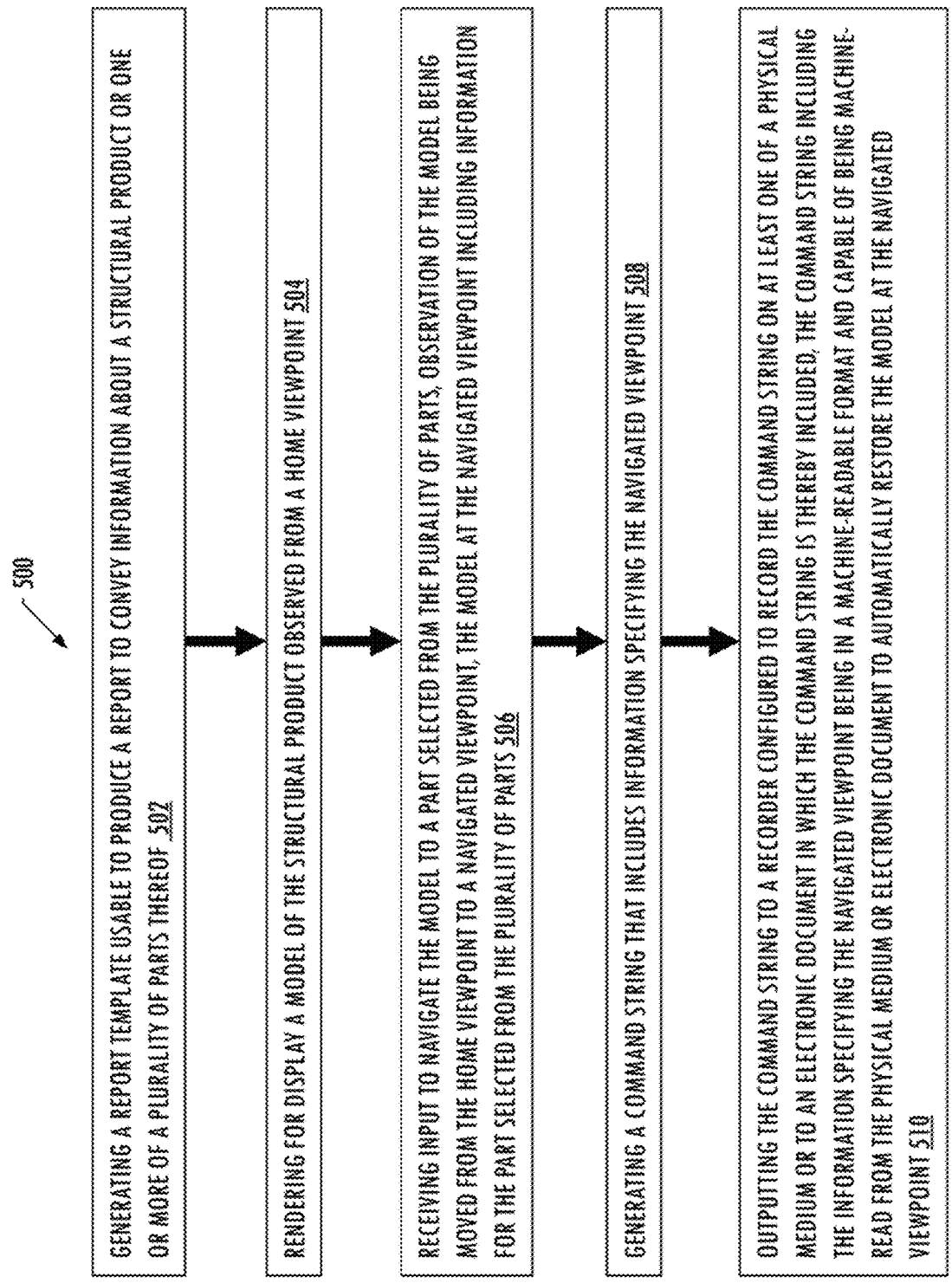
FIG. 5A illustrates a method according to some example implementations.

Leading into the example use cases, FIG. 5A illustrates a method for authoring content for the physical medium or electronic document for use with the 3D viewer. This method may be accomplished by an original equipment manufacturer (OEM) subject matter expert who has knowledge of the model viewer and is able to easily navigate therethrough. The method of FIG. 5A may be performed for any use case including AOG, ER, and NC, as well as other similar use cases.

In FIG. 5A, at a first step 502, authoring of content may include generating a report template usable to produce a report to convey information about a structural product or one or more of a plurality of parts thereof. In a second step 504, authoring of content may also include rendering for display a model of the structural product observed from a home viewpoint. In a third step 506, the authoring of content may also include receiving input to navigate the model to a part selected from the plurality of parts, observation of the model being moved from the home viewpoint to a navigated viewpoint, the model at the navigated viewpoint including information for the part selected from the plurality of parts. In a fourth step 508, the authoring of content may further include generating a command string that includes information specifying the navigated viewpoint. In a fifth step 510, authoring of content may still further include outputting the command string to a recorder configured to record the command string on at least one of a physical medium or to an electronic document in which the command string is thereby included, the command string including the information specifying the navigated viewpoint being in a machine-readable format and capable of being machine-read from the physical medium or electronic document to automatically restore the model at the navigated viewpoint.

Figure 5B:
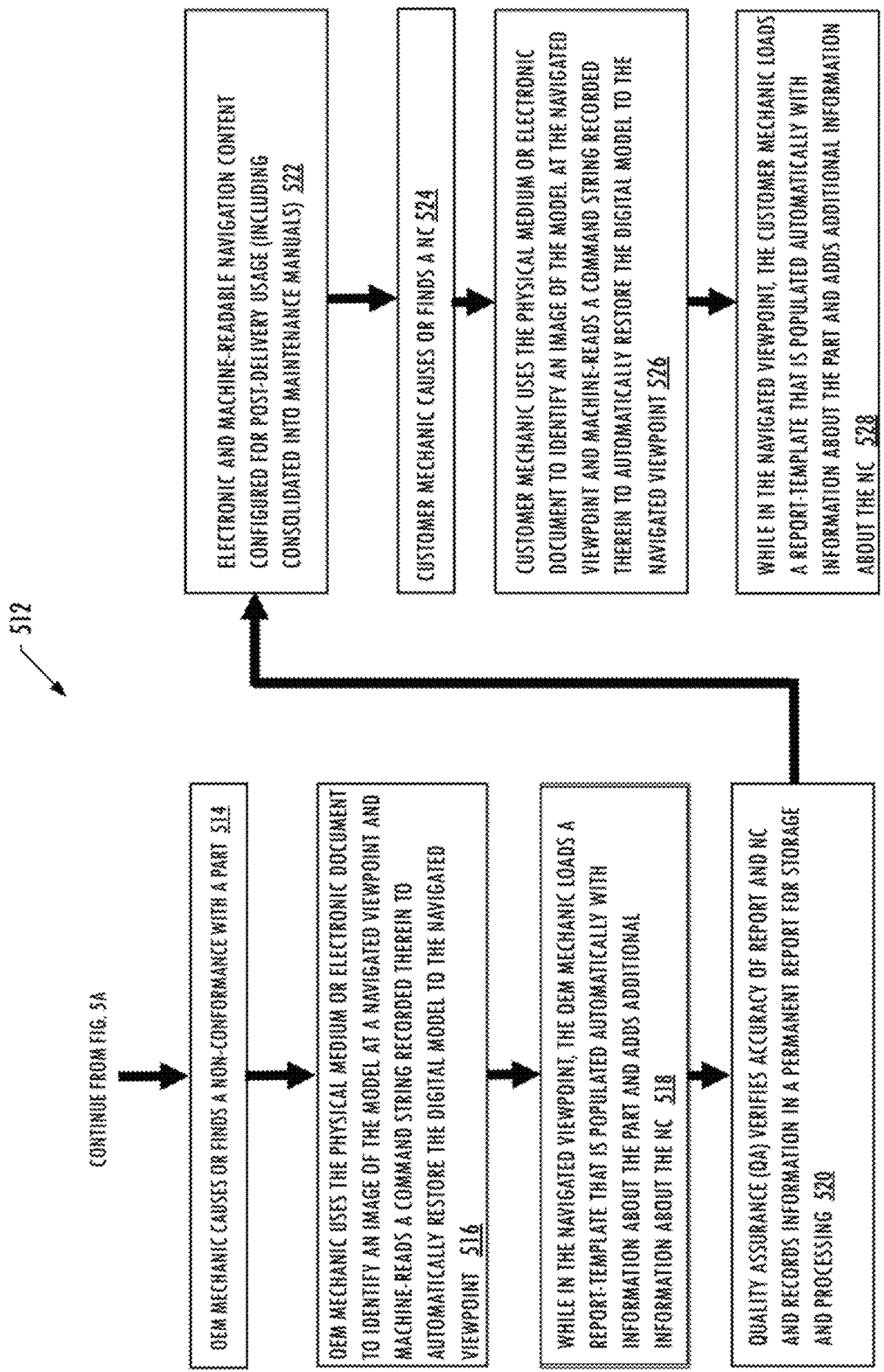
FIG. 5B illustrates a non-conformance (NC) use case according to some example implementations.

As shown in FIG. 5B, various aspects of an example NC use case 512 are illustrated, which may similarly have applicability to other use cases according to example implementations of the present disclosure. The NC use case 512 begins after the method illustrated in FIG. 5A. For example, in the NC use case 512, in a first step 514, a user (e.g., mechanic) working on a physical instance of a structural product (e.g., aircraft) may cause or find an NC with a part of the structural product, which may require documentation before work can continue. In a second step 516, the user may utilize the physical medium or electronic document to identify an image of the model at a navigated viewpoint. The image may be associated with a command string, which enables a user to visually identify the part of the structural product for which the NC has been caused or found within the physical medium or electronic document and scan or otherwise machine-read, using a reader 106, the command string to automatically restore the digital model 110 to the navigated viewpoint within a 3D viewer 108 at a computer system 102B. In a third step 518, within the 3D viewer 108, the user may be able to load a report template 116, which is populated with information for the part selected from the plurality of parts in order to generate a report of the NC.

In a fourth step 520, another user (e.g., quality assurance (QA)) may verify the accuracy of the report and the NC and record the information for processing. The information may be recorded in another report that may be stored thereafter. In some implementations, the reports are easily retrievable from the stored locations, while in others, controlled access/restrictions may be implemented depending on the user accessing the information.

In a fifth step 522, the command strings for each part of the plurality of parts recorded in the physical medium or electronic document may then be grouped or composed for delivery to customers. The grouping may be in the form of a maintenance manual or other reference guide for customers' use.

In a sixth step 524, another user (e.g., customer mechanic) finds or causes a NC with a part of the structural product. The user selects a point (e.g., a selected point) which also selects a part associated with the selected point (e.g., a selected part). Accordingly, in a seventh step 526, the user may utilize the physical medium or electronic document to identify an image of the model at a navigated viewpoint. The image may be associated with a command string, which enables a user to visually identify the part of the structural product for which the NC has been caused or found within the physical medium or electronic document and scan or otherwise machine-read, using a reader 106, the command string to automatically restore the digital model 110 to the navigated viewpoint within a 3D viewer 108 at a computer system 102B. In an eighth step 528, within the 3D viewer 108, the user may be able to load a report template 116, which is populated with information for the part selected from the plurality of parts in order to generate a report of the NC. In some example implementations, the user may note the previously reported NC for that part.

Example implementations of the present disclosure may enable users of 3D viewers to create a link between physical media or electronic documents and virtual environments, as well as a link between data systems. Example implementations may be useful in a number of applications, both in the aerospace industry and outside of the aerospace industry. Even further, example implementations may be useful in conjunction with consumer-level applications that involve a physical object with a particular 2D or 3D location, a 3D visualization application, and object data. Examples of suitable consumer-level applications include those that involve integration of the physical with the virtual, such as those involving the Internet of Things (IoT), 3D printing and the like. Example implementations may provide an easy to use pathway for machine-to-machine communication that these and other suitable applications could leverage.

One particular example of a consumer-level application involves video games that use physical locations and 3D graphics. Navigation data and location specific-information that is stored in a compact, inexpensive, machine-readable form may provide a solution for tracking and data exchange that is easy to create and use. Example implementations may also be appropriate for shoppers in large stores or warehouses, particularly in instances in which models of the buildings are made available. Museum virtual tours and theme park interactive "experiences" with some interactive types of scanning capabilities could be extended with location and session specific data to control a corresponding 3D virtual environment, according to example implementations of the present disclosure.

According to example implementations of the present disclosure, computer system 102A, B may be implemented by various means. Means for implementing the computer system may include hardware alone, or hardware under direction of one or more computer programs from a computer-readable storage medium. In some examples, one or more apparatuses may be configured to function as or otherwise implement the computer system. In examples involving more than one apparatus, the respective apparatuses may be connected to or otherwise in communication with one another in a number of different manners, such as directly or indirectly via a wired or wireless network or the like.

Figure 6:
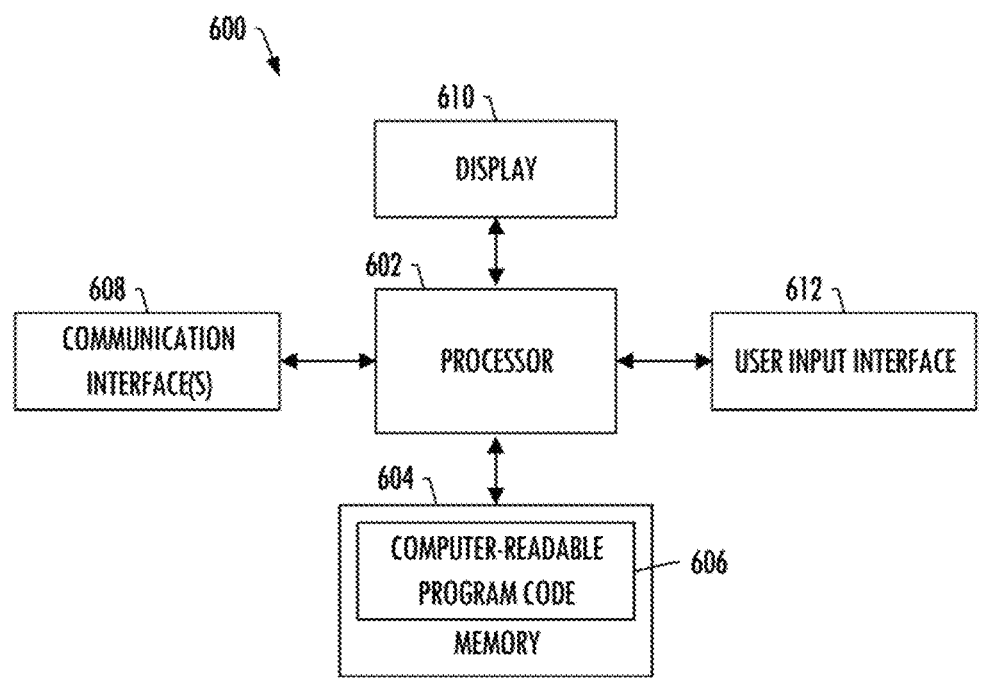
FIG. 6 illustrates an apparatus according to some example implementations.

FIG. 6 illustrates an apparatus 600 that may implement the computer system 102A, B, according to some example implementations of the present disclosure. Generally, an apparatus of example implementations of the present disclosure may comprise, include or be embodied in one or more fixed or portable electronic devices. Examples of suitable electronic devices include a smartphone, tablet computer, laptop computer, desktop computer, workstation computer, smart watch, head-mounted display or other wearable displays, server computer, or the like. The apparatus may include one or more of each of a number of components such as, for example, a processor 602 (e.g., processor unit) connected to a memory 604 (e.g., storage device).

The processor 602 is generally any piece of computer hardware that is capable of processing information such as, for example, data, computer programs (e.g., 3D viewer 108, other computer program(s) 114), and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 604 (of the same or another apparatus).

The processor 602 may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory 604 is generally any piece of computer hardware that is capable of storing information such as, for example, data, computer programs (e.g., computer-readable program code 606) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk—read only memory (CD-ROM), compact disk—read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 604, the processor 602 may also be connected to one or more interfaces for displaying, transmitting and/or receiving information. The interfaces may include a communications interface 608 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 610 and/or one or more input/output (I/O) interfaces 612 (e.g., input/output unit). The display may be configured to present or otherwise display information to a user, suitable examples of which include a liquid crystal display (LCD), light-emitting diode display (LED), plasma display panel (PDP) or the like. The I/O interfaces may be wired or wireless, and may be configured to receive information from a user into the apparatus, such as for processing, storage and/or display. Suitable examples of I/O interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 600 may include a processor 602 and a computer-readable storage medium or memory 604 coupled to the processor, where the processor is configured to execute computer-readable program code 606 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus comprising a processor and a memory storing executable instructions that in response to execution by the processor cause the apparatus to at least:
   generate a report template usable to produce a report to convey information about a structural product or one or more of a plurality of parts thereof, wherein the information for the part of the plurality of parts includes at least a name and location of the part in the structural product, the name and location being retrievable from the model at the navigated viewpoint based on a selected point and a part associated with the selected point;
   render for display, a model of the structural product observed from a home viewpoint;
   receive input to navigate the model to a part selected from the plurality of parts, observation of the model being moved from the home viewpoint to a navigated viewpoint, the model at the navigated viewpoint including information for the part selected from the plurality of parts;

generate a command string that includes information specifying the navigated viewpoint; and output the command string to a recorder configured to record the command string on at least one of a physical medium or to an electronic document in which the command string is thereby included, the command string including the information specifying the navigated viewpoint being in a machine-readable format and capable of being machine-read from the physical medium or electronic document to automatically restore the model at the navigated viewpoint, wherein the report template is loadable and configured to automatically populate with the information for the part of the plurality of parts in the model at the navigated viewpoint.

2. The apparatus of claim 1, wherein the information specifying the navigated viewpoint of the model includes look-from, look-direction, up-direction, and field-of-view values.

3. The apparatus of claim 1, wherein the command string including the information specifying the navigated viewpoint is in the machine-readable format of an automatic identification and data capture (AIDC) technology, and wherein the apparatus being caused to output the command string includes being caused to output the command string to the recorder compatible with the AIDC technology.

4. The apparatus of claim 1, wherein the apparatus being caused to output the command string further includes being caused to output an image of the model at the navigated viewpoint to the recorder that is configured to record the command string and the image on the physical medium, or to the electronic document in which the command string and the image are thereby included, the command string and the image being associated with one another on the physical medium or in the electronic document.

5. The apparatus of claim 1, wherein the apparatus is further caused to execute a software function including a user interface configured to load and display the report template for the part of the plurality of parts selectable in the model at the navigated viewpoint and automatically populate the report template with the information for the part of the plurality of parts at the navigated viewpoint, the user interface also being configured to present or accept information for a manufacturing, inspection, maintenance, or repair procedure that involves the part in order to produce the report.

6. The apparatus of claim 1, wherein the apparatus being caused to output the command string includes being caused to output the command string to the recorder configured to record the command string on the physical medium that is or is affixed to a sheet of paper, and wherein the apparatus is further caused to group the sheet of paper and other sheets of paper on which other command strings are recorded, each of the other command strings including information specifying a respective navigated viewpoint of the model to a respective part of the plurality of parts.

7. The apparatus of claim 1, wherein the apparatus being caused to output the command string includes being caused to output the command string to an electronic page of the electronic document in which the command string is thereby included, and wherein the apparatus is further caused to compose the electronic document including the electronic page and other electronic pages including other command strings, each of the other command strings including information specifying a respective navigated viewpoint of the model to a respective part of the plurality of parts.

8. A method comprising:

generating a report template usable to produce a report to convey information about a structural product or one or more of a plurality of parts thereof, wherein the information for the part of the plurality of parts includes at least a name and location of the part in the structural product, the name and location being retrievable from the model at the navigated viewpoint based on a selected point and a part associated with the selected point;

rendering for display, a model of the structural product observed from a home viewpoint;

receiving input to navigate the model to a part selected from the plurality of parts, observation of the model being moved from the home viewpoint to a navigated viewpoint, the model at the navigated viewpoint including information for the part selected from the plurality of parts;

generating a command string that includes information specifying the navigated viewpoint; and outputting the command string to a recorder configured to record the command string on at least one of a physical medium or to an electronic document in which the command string is thereby included, the command string including the information specifying the navigated viewpoint being in a machine-readable format and capable of being machine-read from the physical medium or electronic document to automatically restore the model at the navigated viewpoint, wherein the report template is loadable and configured to automatically populate with the information for the part of the plurality of parts in the model at the navigated viewpoint.

9. The method of claim 8, wherein the information specifying the navigated viewpoint of the model includes look-from, look-direction, up-direction, and field-of-view values.

10. The method of claim 8, wherein the command string including the information specifying the navigated viewpoint is in the machine-readable format of an automatic identification and data capture (AIDC) technology, and wherein outputting the command string includes outputting the command string to the recorder compatible with the AIDC technology.

11. The method of claim 8, wherein outputting the command string further includes outputting an image of the model at the navigated viewpoint to the recorder that is configured to record the command string and the image on the physical medium, or to the electronic document in which the command string and the image are thereby included, the command string and the image being associated with one another on the physical medium or in the electronic document.

12. The method of claim 8, further comprising executing a software function including a user interface configured to load and display the report template for the part of the plurality of parts selectable in the model at the navigated viewpoint and automatically populate the report template with the information for the part of the plurality of parts at the navigated viewpoint, the user interface also being configured to present or accept information for a manufacturing, inspection, maintenance, or repair procedure that involves the part in order to produce the report.

13. The method of claim 8, wherein outputting the command string includes outputting the command string to the recorder configured to record the command string on the physical medium that is or is affixed to a sheet of paper, and wherein the method further comprises grouping the sheet of paper and other sheets of paper on which other command strings are recorded, each of the other command strings including information specifying a respective navigated viewpoint of the model to a respective part of the plurality of parts.

14. The method of claim 8, wherein outputting the command string includes outputting the command string to an electronic page of the electronic document in which the command string is thereby included, and wherein the method further comprises composing the electronic document including the electronic page and other electronic pages including other command strings, each of the other command strings including information specifying a respective navigated viewpoint of the model to a respective part of the plurality of parts.

15. A computer-readable storage medium that is non-transitory and has computer-readable program code portions stored therein that, in response to execution by a processor, cause an apparatus to at least:
   generate a report template usable to produce a report to convey information about a structural product or one or more of a plurality of parts thereof, wherein the information for the part of the plurality of parts includes at least a name and location of the part in the structural product, the name and location being retrievable from the model at the navigated viewpoint based on a selected point and a part associated with the selected point;
   render for display, a model of the structural product observed from a home viewpoint;
   receive input to navigate the model to a part selected from the plurality of parts, observation of the model being moved from the home viewpoint to a navigated viewpoint, the model at the navigated viewpoint including information for the part selected from the plurality of parts;
   generate a command string that includes information specifying the navigated viewpoint; and
   output the command string to a recorder configured to record the command string on at least one of a physical medium or to an electronic document in which the command string is thereby included, the command string including the information specifying the navigated viewpoint being in a machine-readable format and capable of being machine-read from the physical medium or electronic document to automatically restore the model at the navigated viewpoint,
   wherein the report template is loadable and configured to automatically populate with the information for the part of the plurality of parts in the model at the navigated viewpoint.

16. The computer-readable storage medium of claim 15, wherein the information specifying the navigated viewpoint of the model includes look-from, look-direction, up-direction, and field-of-view values.

17. The computer-readable storage medium of claim 15, wherein the command string including the information specifying the navigated viewpoint is in the machine-readable format of an automatic identification and data capture (AIDC) technology, and wherein the apparatus being caused to output the command string includes being caused to output the command string to the recorder compatible with the AIDC technology.

18. The computer-readable storage medium of claim 15, wherein the apparatus being caused to output the command string further includes being caused to output an image of the model at the navigated viewpoint to the recorder that is configured to record the command string and the image on the physical medium, or to the electronic document in which the command string and the image are thereby included, the command string and the image being associated with one another on the physical medium or in the electronic document.

19. The computer-readable storage medium of claim 15, having further computer-readable program code portions stored therein that, in response to execution by the processor, cause the apparatus to further at least: execute a software function including a user interface configured to load and display the report template for the part of the plurality of parts selectable in the model at the navigated viewpoint and automatically populate the report template with the information for the part of the plurality of parts at the navigated viewpoint, the user interface also being configured to present or accept information for a manufacturing, inspection, maintenance, or repair procedure that involves the part in order to produce the report.

20. The computer-readable storage medium of claim 15, wherein the apparatus being caused to output the command string includes being caused to output the command string to the recorder configured to record the command string on the physical medium that is or is affixed to a sheet of paper, and having further computer-readable program code portions stored therein that, in response to execution by the processor, cause the apparatus to further at least: group the sheet of paper and other sheets of paper on which other command strings are recorded, each of the other command strings including information specifying a respective navigated viewpoint of the model to a respective part of the plurality of parts.

21. The computer-readable storage medium of claim 15, wherein the apparatus being caused to output the command string includes being caused to output the command string to an electronic page of the electronic document in which the command string is thereby included, and having further computer-readable program code portions stored therein that, in response to execution by the processor, cause the apparatus to further at least: compose the electronic document including the electronic page and other electronic pages including other command strings, each of the other command strings including information specifying a respective navigated viewpoint of the model to a respective part of the plurality of parts.

* * * * *